United States Patent
Kishi et al.

(10) Patent No.: US 10,584,035 B2
(45) Date of Patent: Mar. 10, 2020

(54) PURIFICATION SYSTEM OF TRICHLOROSILANE AND SILICON CRYSTAL

(71) Applicant: SHIN-ETSU CHEMICAL CO., LTD., Tokyo (JP)

(72) Inventors: Ryota Kishi, Niigata (JP); Masahiko Ishida, Niigata (JP); Shigeyoshi Netsu, Niigata (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 16 days.

(21) Appl. No.: 15/891,711

(22) Filed: Feb. 8, 2018

(65) Prior Publication Data

US 2018/0244529 A1 Aug. 30, 2018

(30) Foreign Application Priority Data

Feb. 24, 2017 (JP) .................... 2017-033172
Dec. 18, 2017 (JP) .................... 2017-241644

(51) Int. Cl.
*B01D 3/00* (2006.01)
*C01B 33/107* (2006.01)
(Continued)

(52) U.S. Cl.
CPC ........ *C01B 33/10763* (2013.01); *B01D 3/009* (2013.01); *C01B 33/10794* (2013.01); *C30B 29/06* (2013.01); *C30B 35/007* (2013.01)

(58) Field of Classification Search
CPC ............. B01D 3/009; C01B 33/10763; C01B 33/10794; C30B 29/06; C30B 35/007
See application file for complete search history.

(56) References Cited

U.S. PATENT DOCUMENTS 3,252,752 A 5/1966 Pohl et al.
7,879,198 B2 * 2/2011 Ghetti ............... C01B 33/10794
                                              203/29
(Continued)

FOREIGN PATENT DOCUMENTS

DE   1 289 834 B   2/1969
GB     994076 A    6/1965
(Continued)

*Primary Examiner* — Jonathan Miller
(74) *Attorney, Agent, or Firm* — Westerman, Hattori, Daniels & Adrian, LLP

(57) ABSTRACT

A system for purifying trichlorosilane that can prevent re-contamination by the dissociation of an adduct occurring in association with the conversion of high boiling point compounds or the remaining of impurities due to an equilibrium constraint is provided. Trichlorosilane containing impurities serving as a donor or an acceptor in silicon crystals is supplied to a multistage impurity conversion step. These impurities in the trichlorosilane are converted into high boiling point compounds in the presence of a distillation aid. A plurality of impurity conversion step sections ($10^1$ to $10^n$) are connected in series, and any of the impurity conversion step sections comprises a reception section a for the trichlorosilane from the preceding stage section, an introduction section b for the distillation aid, a transmission section c for the trichlorosilane to the subsequent stage section, and a drain section d that discharges a remainder out of the impurity conversion step section.

9 Claims, 6 Drawing Sheets

(51) Int. Cl.
     *C30B 29/06*      (2006.01)
     *C30B 35/00*      (2006.01)

(56) References Cited

U.S. PATENT DOCUMENTS

| | | | | |
|---|---|---|---|---|
| 8,404,205 | B2 * | 3/2013 | Prine | C01B 33/035 |
| | | | | 423/342 |
| 9,126,838 | B2 * | 9/2015 | Hasegawa | C01B 33/10778 |
| 9,266,742 | B2 * | 2/2016 | Tanaka | C01B 33/1071 |
| 2008/0314728 | A1 * | 12/2008 | Ghetti | C01B 33/10794 |
| | | | | 203/38 |
| 2009/0068081 | A1 * | 3/2009 | Uehara | C01B 33/10778 |
| | | | | 423/342 |
| 2012/0100042 | A1 * | 4/2012 | Bhusarapu | C01B 33/035 |
| | | | | 422/141 |
| 2012/0100061 | A1 * | 4/2012 | Bhusarapu | C01B 33/03 |
| | | | | 423/350 |
| 2013/0001063 | A1 * | 1/2013 | Tanaka | C01B 33/1071 |
| | | | | 203/28 |
| 2013/0177492 | A1 * | 7/2013 | Hasegawa | C01B 33/10778 |
| | | | | 423/325 |
| 2016/0002052 | A1 * | 1/2016 | Ishida | B01J 31/0237 |
| | | | | 423/342 |
| 2016/0279628 | A1 * | 9/2016 | Ishida | C01B 33/10778 |

FOREIGN PATENT DOCUMENTS

| | | |
|---|---|---|
| JP | 2005-67979 A | 3/2005 |
| JP | 2009-62213 A | 3/2009 |
| JP | 2010-269994 A | 12/2010 |
| JP | 2012-91960 A | 5/2012 |
| JP | 2013-1632 A | 1/2013 |

* cited by examiner (A)

(B)

(A)

(B)

PURIFICATION SYSTEM OF TRICHLOROSILANE AND SILICON CRYSTAL

BACKGROUND OF THE INVENTION

Field of the Invention

The present invention relates to a technique for producing high purity trichlorosilane and more particularly to a technique for obtaining high purity trichlorosilane by removing donor and acceptor impurities from trichlorosilane containing these impurities.

Description of Related Art

A semiconductor grade of high purity polycrystalline silicon is generally produced by the Siemens process using a gas mainly containing trichlorosilane as a raw material. Therefore, extremely high purity is required for trichlorosilane used as a raw material.

Among impurities contained in the raw material trichlorosilane, particularly, elements such as phosphorus and arsenic serving as a donor and boron and aluminum serving as an acceptor in silicon crystals are known to have noticeable effects on electrical properties when incorporated in polycrystalline silicon even if the content is very low. Therefore, it is extremely important and meaningful for practical use to provide a technique for efficiently removing donor and acceptor impurities contained in trichlorosilane.

Trichlorosilane for producing polycrystalline silicon is generally obtained by purifying crude chlorosilanes obtained by a known method from metallurgical grade silicon (metallurgical silicon) containing a large amount of impurities, by techniques such as distillation.

In metallurgical silicon, the donor and acceptor impurities described above are contained in the order of several hundred ppma in terms of the atomic ratio. Such metallurgical silicon will be purified to remove impurities. In this purification step, if the removal of the impurities is insufficient, then the impurities remain in the final trichlorosilane obtained, which results in the incorporation of the remaining impurities in polycrystalline silicon and the reduction in quality.

Donor and acceptor impurities contained in the metallurgical silicon are considered to be hydrogenated, chlorinated, or the like into compounds with a variety of structures in the step of producing crude chlorosilanes and mixed into the crude chlorosilanes. If the boiling points of such compounds are close to the boiling point of trichlorosilane, then it is difficult to separate or remove the aforementioned compounds sufficiently by distillation.

From such circumstances, various methods for reducing the content of donor and acceptor impurities in chlorosilanes have been proposed.

One of such methods is a method for removing donor and acceptor impurities in chlorosilanes by the adsorption of the impurities onto alumina, silica gel, active carbon, or the like.

For example, U.S. Pat. No. 3,252,752 discloses a method for immobilizing a substance having a lone electron pair onto an adsorbent such as active carbon or silica gel and conducting gaseous chlorosilanes over the immobilized substance to capture and remove impurities. Moreover, German Patent No. 1,289,834 discloses a method for contacting chlorosilanes in a state of liquid or vapor with activated alumina to remove impurities. Furthermore, Japanese Patent Laid-Open No. 2010-269994 discloses a method for removing impurities by contacting liquid chlorosilanes with spherical active carbon.

As an alternative method, a method for adding an organic substance to chlorosilanes as a distillation aid to produce adducts with donor and acceptor impurities and then performing distillation and purification to obtain high purity chlorosilanes.

For example, Japanese Patent Laid-Open No. 2005-67979 discloses a method for adding ethers to chlorosilanes and performing distillation and purification. Moreover, Japanese Patent Laid-Open No. 2009-62213 discloses a method for treating chlorosilanes in the presence of aromatic aldehyde and oxygen to convert impurities into high boiling point compounds and then perform distillation or the like of the treated chlorosilanes to separate the high boiling point compound of impurities and the chlorosilanes. Furthermore, Japanese Patent Laid-Open No. 2013-1632 discloses a method for providing, for the purpose of preventing re-contamination due to the re-dissociation of high boiling point products of impurities, a vaporizer between an impurity converting process with a distillation aid and a distillation and purification step to separate the high boiling point products of impurities and the distillation aid from chlorosilanes. Moreover, Japanese Patent Laid-Open No. 2012-91960 discloses an invention of a method for purifying chlorosilanes comprising adding an aldehyde compound represented by the general formula Ar—R—CHO (wherein Ar is a substituted or unsubstituted aryl group and R is an organic group having 2 or more carbon atoms) to convert donor and acceptor impurities contained in a chlorosilane distillate into high boiling point products in an impurity conversion step in order to remove the donor and acceptor impurities from the chlorosilane distillate to reduce the content thereof and sending the chlorosilane distillate after the conversion into the high boiling point products to a purification step.

The method for removing impurities contained in chlorosilanes by the adsorption of the impurities onto alumina, silica gel, active carbon, or the like described above has the following problems: the method requires an apparatus such as an adsorption tower, which makes facilities complicated, and the handling of the adsorbate after breakthrough and/or the waste disposal treatment is troublesome. Moreover, the replacement of the adsorbent involves the opening of the system and thus causes the corrosion in the apparatus and may result in the contamination of chlorosilanes.

Moreover, the method for adding an organic preparation as a distillation aid to chlorosilanes to produce adducts with donor and acceptor impurities and then performing distillation and purification to obtain high purity chlorosilanes has the following problem: if the produced adducts are unstable, then the adducts dissociate by heating or the like during the distillation operation and return back to the compounds that are hard to separate from the chlorosilanes. Moreover, another problem is that if the production of the adducts is an equilibrium reaction, then an impurity that is not converted into a high boiling point compound remains constantly.

The present invention has been made to address the aforementioned problems of conventional methods for purifying chlorosilanes and it is an object of the present invention to provide a system for purifying trichlorosilane that can efficiently remove donor and acceptor impurities from trichlorosilane by making full use of the effect of a distillation aid and prevent re-contamination by the dissociation of an adduct occurring in association with the conversion into a high boiling point compound or remaining impurities due to an equilibrium constraint.

SUMMARY OF THE INVENTION

To achieve the aforementioned object, the system for purifying trichlorosilane according to the present invention is a system for purifying trichlorosilane comprising an impurity serving as a donor or an acceptor in a silicon crystal, the system comprising an impurity conversion section that converts an impurity comprised in the trichlorosilane into a high boiling point compound in the presence of a distillation aid and a purification section that distills and purifies the trichlorosilane supplied from the impurity conversion section, the impurity conversion section being composed of a plurality of impurity conversion step sections.

In a certain aspect, the plurality of impurity conversion step sections are connected in series, and any of the impurity conversion step sections comprises a reception section for the trichlorosilane from the preceding stage section, an introduction section for the distillation aid, a transmission section for the trichlorosilane to the subsequent stage section, and a drain section that discharges a remainder from the impurity conversion step section.

Moreover, in a certain aspect, the plurality of impurity conversion step sections are connected in series, any of the impurity conversion step sections comprises a reception section for the trichlorosilane from the preceding stage section, an introduction section for the distillation aid, and a transmission section for the trichlorosilane to the subsequent stage section, and any of the impurity conversion step sections other than the first impurity conversion step section comprises a drain section that discharges a remainder to the preceding impurity conversion step section.

Moreover, in a certain aspect, in at least one of the plurality of impurity conversion step sections, the reception section for the trichlorosilane from the preceding stage section and the introduction section for the distillation aid are integrated.

Moreover, in a certain aspect, any of the impurity conversion step sections comprises a vaporizer, and the trichlorosilane from which the high boiling point compound is separated by vaporizing, with the vaporizer, the trichlorosilane treated in the impurity conversion step section is transmitted to the subsequent stage section.

Furthermore, in a certain aspect, at least one of the plurality of impurity conversion step sections comprises a distiller that separates the distillation aid and the high boiling point compound between the vaporizer and the transmission section.

Furthermore, in a certain aspect, the transmission of the trichlorosilane from which the high boiling point compound is separated to the subsequent stage section is performed in a state of a condensate.

For example, the distillation aid comprises at least one compound selected from aromatic aldehyde, oxygen, and ozone.

The amount of substance of the distillation aid supplied to each of the plurality of impurity conversion step sections is preferably 1 to $10^9$ times, more preferably $10^2$ to $10^9$ times, and further preferably $10^4$ to $10^9$ times the amount that allows the distillation aid to react with the total amount of the impurities contained in the chlorosilane to thereby convert all thereof into the high boiling point compounds.

Moreover, the reaction temperature in a state where the distillation aid is introduced into the impurity conversion step sections is preferably set at 0° C. or more and 150° C. and less.

The silicon crystal according to the present invention is a silicon crystal comprising a donor impurity at a concentration of 2 ppta or less and an acceptor impurity at a concentration of 20 ppta or less, obtained from the trichlorosilane produced by the aforementioned system as a raw material.

In the system according to the present invention, in purifying trichlorosilane comprising an impurity serving as a donor or an acceptor in a silicon crystal, an impurity conversion section that converts an impurity comprised in the trichlorosilane into a high boiling point compound in the presence of a distillation aid is composed of a plurality of impurity conversion step sections. Therefore, re-contamination by the dissociation of an adduct and/or the remaining of impurities due to an equilibrium constraint can be prevented.

As a result, the mixing of donor and acceptor impurities into polycrystalline silicon is suppressed in the production of polycrystalline silicon using trichlorosilane purified by the aforementioned system.

Moreover, in one aspect of the system according to the present invention, the discharge of the distillation aid and trichlorosilane out of the system can be minimized because the remainder of trichlorosilane containing the distillation aid is re-supplied from the subsequent stage section to the preceding stage section.

Moreover, a system of an aspect in which trichlorosilane is supplied from the preceding stage section to the subsequent stage section in a gas state requires no special facilities or electricity for liquefaction.

DETAILED DESCRIPTION OF THE PREFERRED EMBODIMENTS

The system for purifying trichlorosilane according to the present invention will be described below with reference to the drawings.

High purity trichlorosilane used, for example, in the production of polycrystalline silicon is obtained by purifying, by a technique such as distillation, crude trichlorosilane obtained by a known method from metallurgical silicon containing a large amount of impurities, as described above. Moreover, if gas recovered from a step of precipitating polycrystalline silicon is distilled and purified to separate high purity trichlorosilane, then the high purity trichlorosilane can be reused in a step of producing polycrystalline silicon.

However, into crude trichlorosilane as described above, donor and acceptor impurities contained in metallurgical silicon serving as a raw material, a member or the like used in a reactor for polycrystalline silicon precipitation are mixed.

Among such donor and acceptor impurities, impurities having boiling points close to that of trichlorosilane to be purified are not easy to separate.

As disclosed in Japanese Patent Laid-Open No. 2005-67979 and Japanese Patent Laid-Open No. 2009-62213 described above, methods for producing adducts with donor and acceptor impurities using a distillation aid and separating these adducts by the subsequent distillation to purify trichlorosilane have been widely used till now. In particular, when aromatic aldehyde is used as a distillation aid in the presence of oxygen, both donor and acceptor impurities can be removed simultaneously.

However, as already described, such methods have the following problem: in distillation and separation using a distillation aid, if the adducts with donor and acceptor impurities and the distillation aid are unstable, then the dissociation of the adducts takes place by an operation such as heating in the subsequent distillation step to return back to the compounds that are hard to separate from chlorosilanes. Moreover, another problem is that if the production of the adduct is an equilibrium reaction, then an impurity that is not converted into a high boiling point compound remains constantly and become detrimental to high purity purification.

In the present invention, in the process of converting the donor and acceptor impurities comprised in trichlorosilane into high boiling point compounds using a distillation aid in an impurity conversion step and then distilling and separating the impurities, making the impurity conversion step multistage makes it possible to obtain high purity trichlorosilane while suppressing the dissociation of the adducts and the remaining of the impurities due to the equilibrium constraint as described above.

Figure 1:
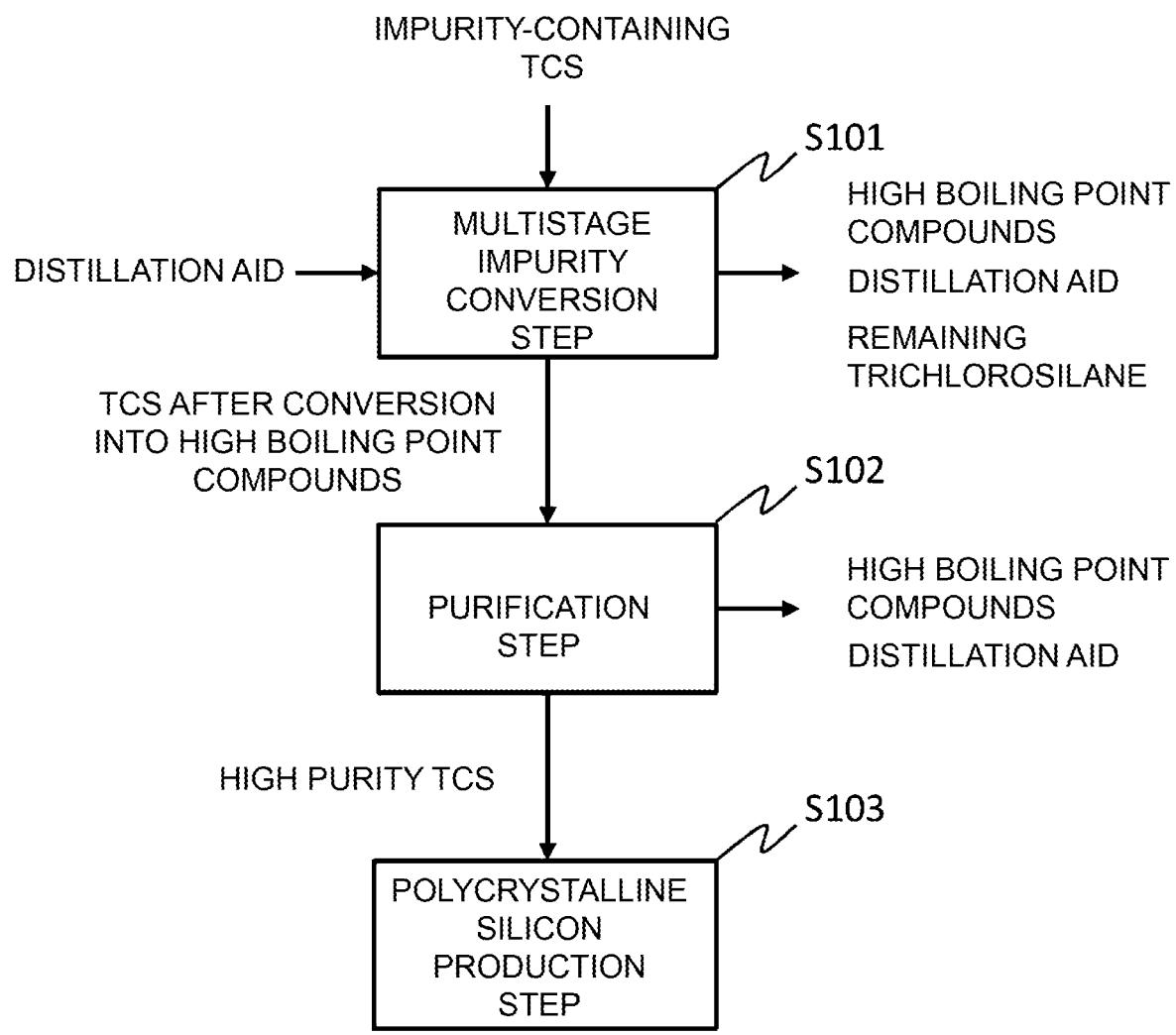
FIG. 1 is a block diagram of an example of a system that separates high purity trichlorosilane from trichlorosilane containing donor and acceptor impurities by a multistage impurity conversion step and a purification step and uses the obtained high purity trichlorosilane as a raw material in a polycrystalline silicon production step.

FIG. 1 is a block diagram of an example of a system that separates high purity trichlorosilane from trichlorosilane (impurity-containing TCS) comprising donor and acceptor impurities by a purification step of trichlorosilane consisting of a multistage impurity conversion step (S101) and a purification step (S102) and uses the obtained high purity trichlorosilane as a raw material in a polycrystalline silicon production step (S103).

Trichlorosilane comprising impurities that serve as a donor or an acceptor in silicon crystals is supplied to the multistage impurity conversion step (S101). The impurities in this trichlorosilane are converted to high boiling point compounds in the presence of a distillation aid. Here, the term "high boiling point compound" refers to a compound having a boiling point higher than that of trichlorosilane. The temperature difference between these boiling points is preferably 25° C. or more, more preferably 50° C. or more, and further preferably 75° C. or more. Trichlorosilane after this treatment is sent to the purification step (S102), and high purity trichlorosilane is separated. This high purity trichlorosilane may be used as a raw material in the polycrystalline silicon production step (S103).

Accordingly, the system for purifying trichlorosilane according to the present invention is a system for purifying trichlorosilane comprising an impurity serving as a donor or an acceptor in a silicon crystal, the system comprising an impurity conversion section that converts an impurity comprised in the trichlorosilane into a high boiling point compound in the presence of a distillation aid and a purification section that distills and purifies the trichlorosilane supplied from the impurity conversion section, the impurity conversion section being composed of a plurality of impurity conversion step sections.

Figure 2:
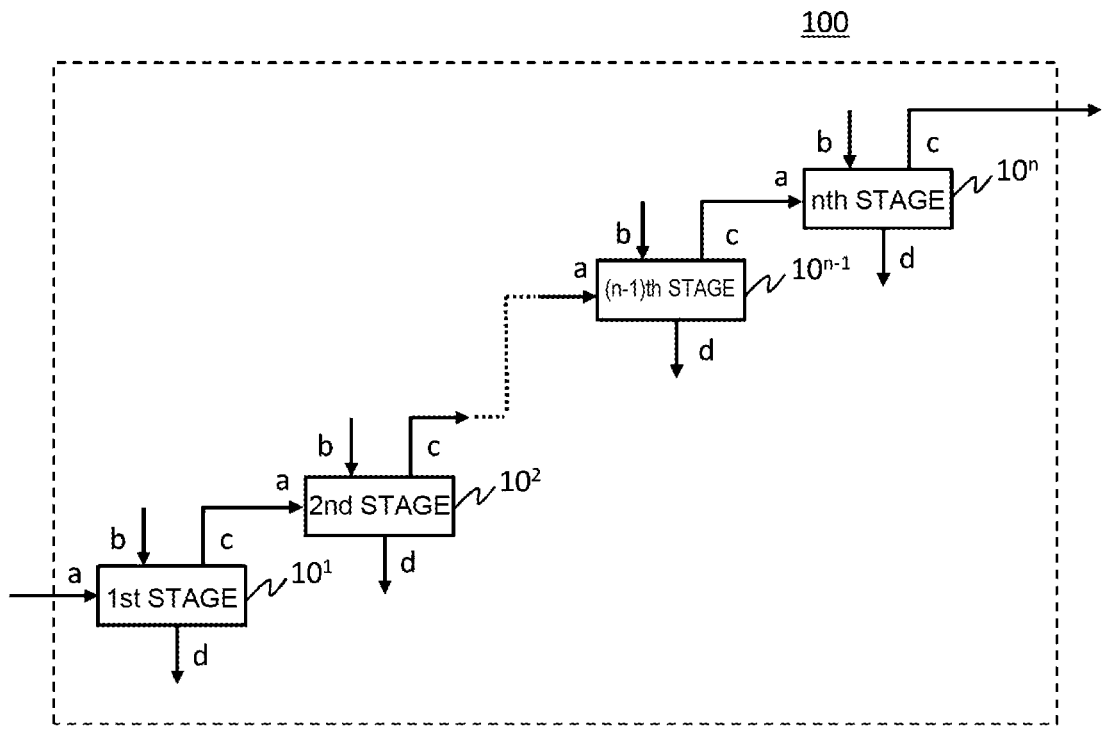
FIG. 2 is a block diagram illustrating a first configuration example of a multistage impurity conversion section that performs the multistage impurity conversion step.

FIG. 2 is a block diagram illustrating a first configuration example of a multistage impurity conversion section 100 that performs the aforementioned multistage impurity conversion step (S101). A plurality of impurity conversion step sections (n impurity conversion step sections from stage 1 to stage n: $10^1$ to $10^n$) are connected in series, and any of the impurity conversion step sections comprises a reception section a for the trichlorosilane from the preceding stage section, an introduction section b for the distillation aid, a transmission section c for the trichlorosilane to the subsequent stage section, and a drain section d that discharges a remainder (the high boiling point compounds, the distillation aid, remaining trichlorosilane) out of the impurity conversion step section.

Figure 3:
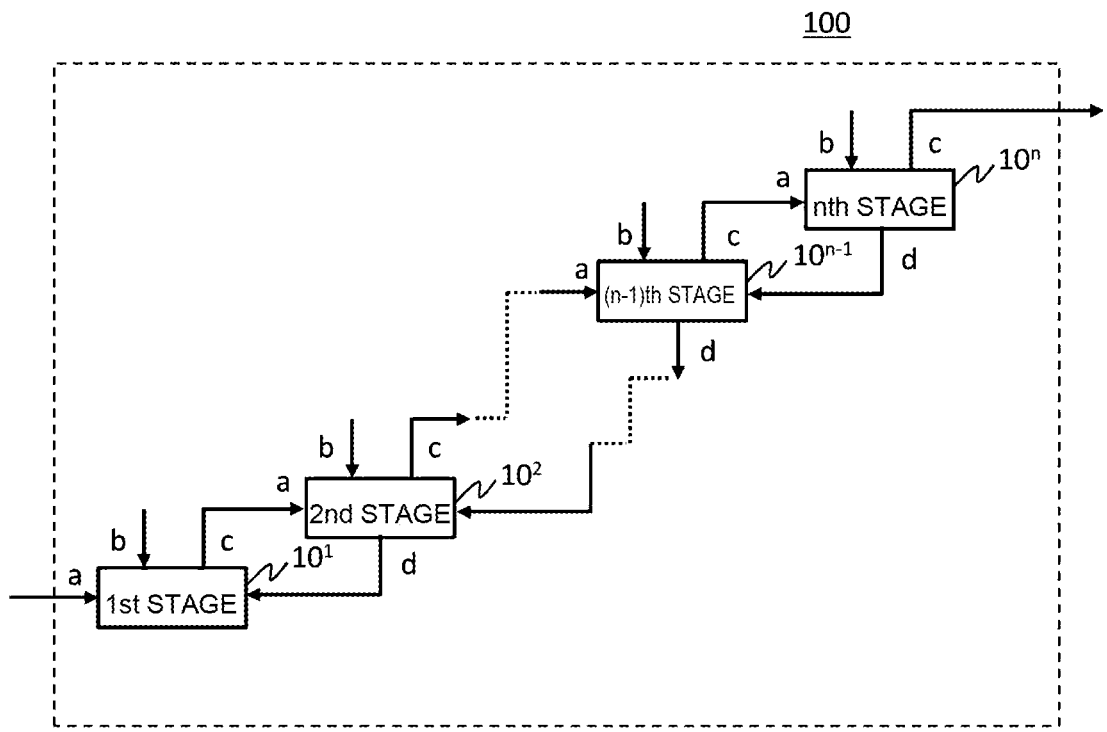
FIG. 3 is a block diagram illustrating a second configuration example of the multistage impurity conversion section that performs the multistage impurity conversion step.

FIG. 3 is a block diagram illustrating a second configuration example of the multistage impurity conversion section 100 that performs the aforementioned multistage impurity conversion step (S101). Also in this aspect, a plurality of impurity conversion step sections (n impurity conversion step sections from stage 1 to stage n: $10^1$ to $10^n$) are connected in series, and any of the impurity conversion step sections comprises a reception section a for the trichlorosilane from the preceding stage section, an introduction section b for the distillation aid, and a transmission section c for the trichlorosilane to the subsequent stage section. In this aspect, any of the impurity conversion step sections other than the first impurity conversion step section $10^1$ comprises a drain section d that discharges a remainder (the high boiling point compounds, the distillation aid, remaining trichlorosilane) to the preceding impurity conversion step section.

Figure 4:
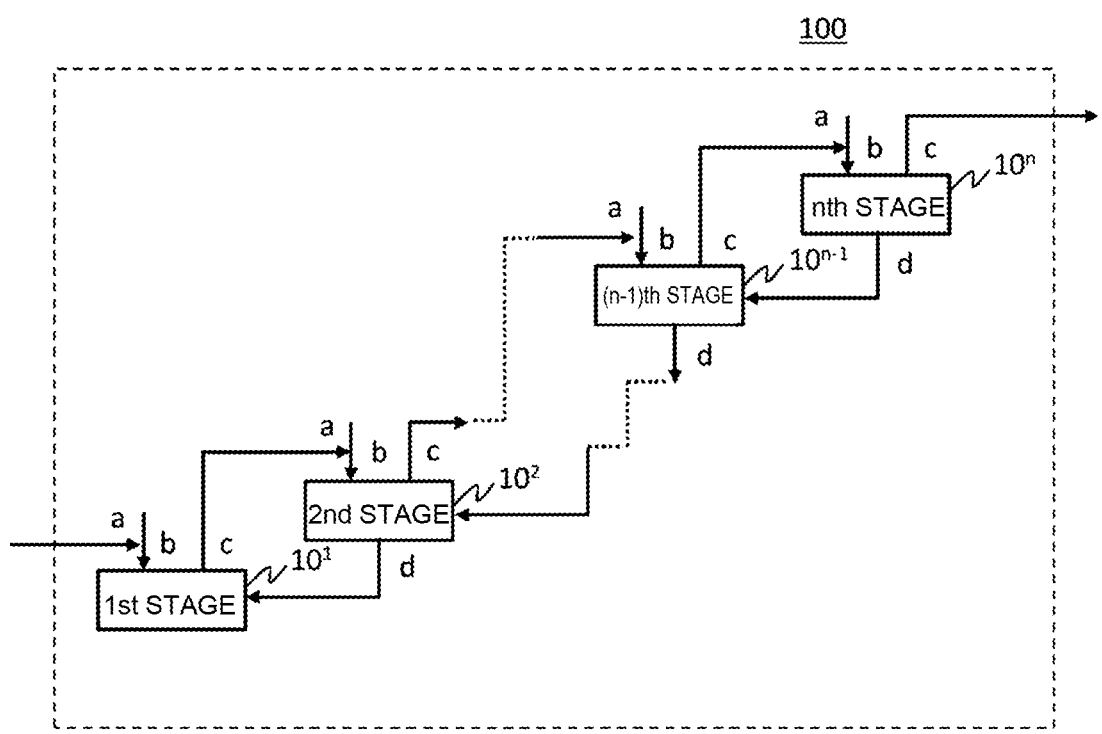
FIG. 4 is a block diagram illustrating a third configuration example of the multistage impurity conversion section that performs the multistage impurity conversion step.

FIG. 4 is a block diagram illustrating a third configuration example of the multistage impurity conversion section 100 that performs the aforementioned multistage impurity conversion step (S101). In this aspect, the reception section a for trichlorosilane from the preceding stage section and the introduction section b for the distillation aid in the aspect illustrated in FIG. 3 are integrated. Although the reception section a for trichlorosilane and the introduction section b for the distillation aid are integrated in any of the impurity conversion step sections in the aspect illustrated in FIG. 4, in another aspect, they may be integrated as described above in at least one of the plurality of impurity conversion step sections.

Figure 5:
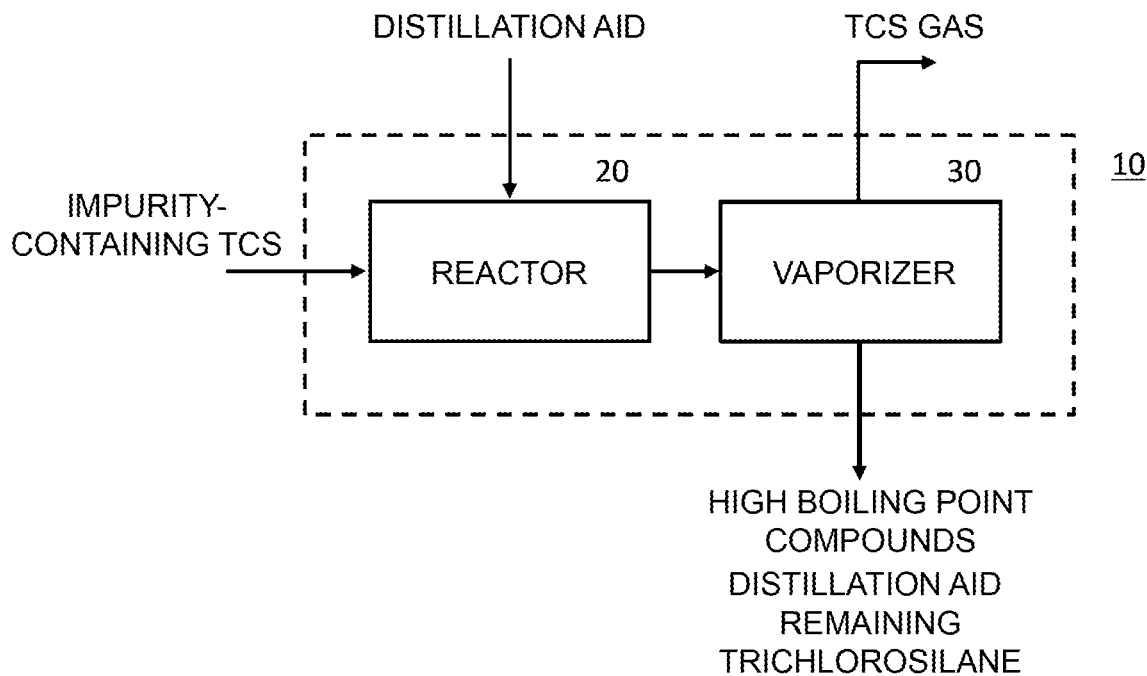
FIG. 5 is a block diagram illustrating first and second configuration examples of the impurity conversion step section.
Figure 5:
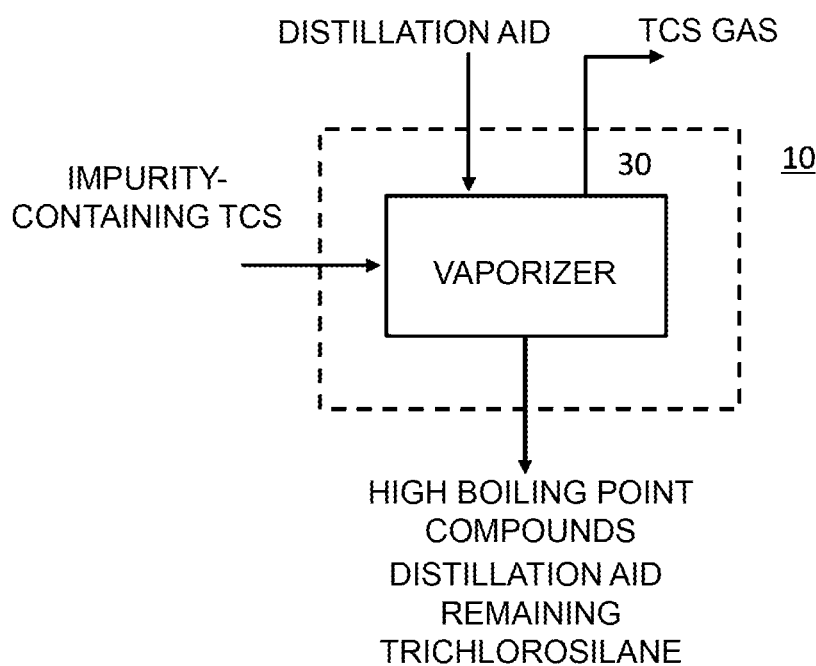

FIG. 5(A) and FIG. 5(B) are block diagrams illustrating first and second configuration examples of the aforementioned impurity conversion step sections. In the example illustrated in FIG. 5(A), the impurity conversion step section comprises a reactor 20 and a vaporizer 30 provided after the reactor 20. In the example illustrated in FIG. 5(B), no reactor 20 is provided.

Figure 6:
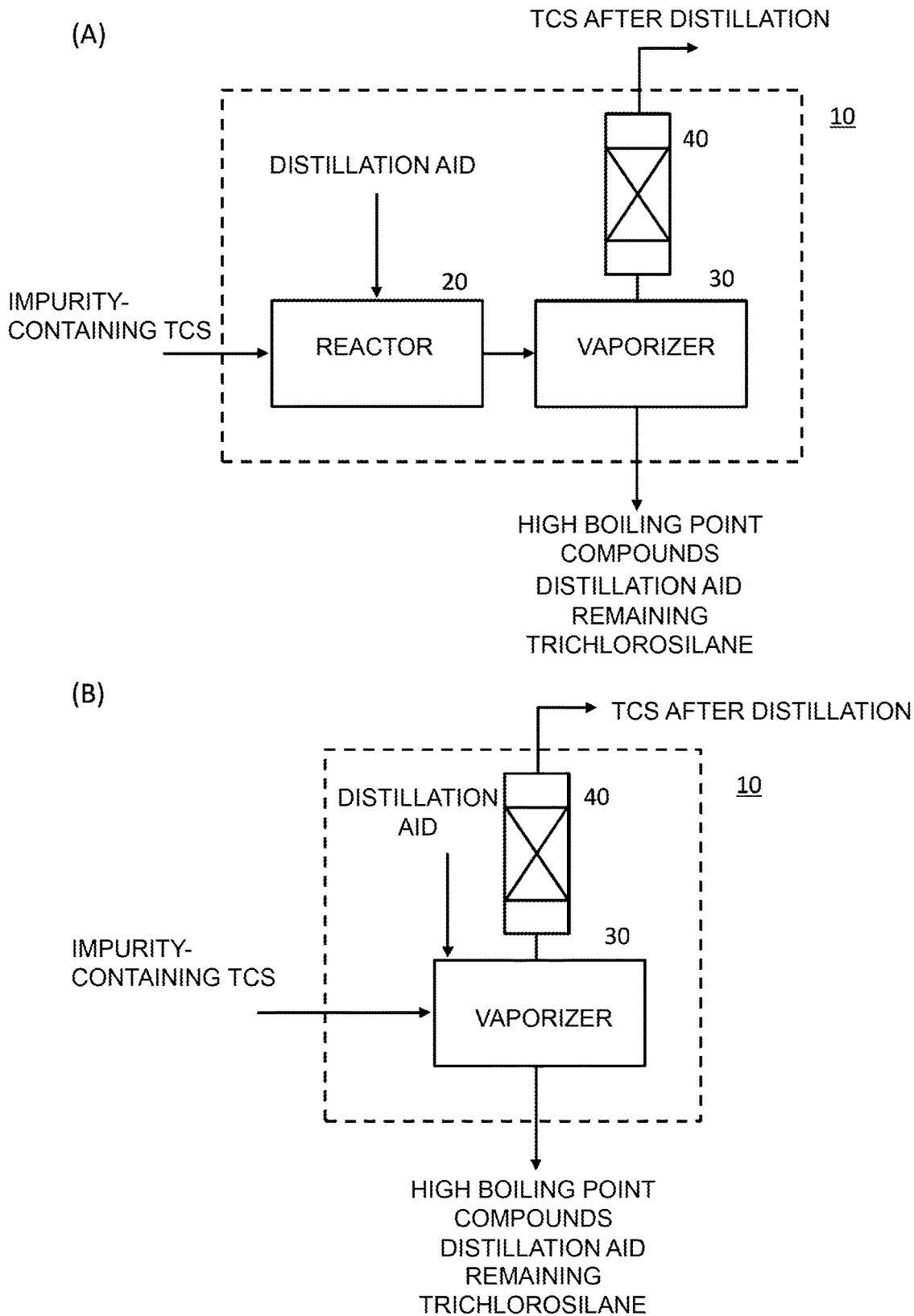
FIG. 6 is a block diagram illustrating third and fourth configuration examples of the impurity conversion step section.

In any of the configuration examples described above, a distiller 40 for further separation of high boiling point compounds and the distillation aid may be provided after the vaporizer 30, as illustrated in FIG. 6(A) and FIG. 6(B).

That is to say, any of the impurity conversion step sections 10 comprises a vaporizer 30, and the trichlorosilane from which high boiling point compounds are separated is transmitted to the subsequent stage section by vaporizing, with the vaporizer 30, the trichlorosilane treated in the impurity conversion step section 10.

The reactor 20 is for efficiently converting impurities into high boiling point compounds, and when the reactor 20 is provided, the distillation aid is supplied to this reactor 20. Moreover, in order to efficiently convert impurities into high boiling point compounds, oxygen or ozone is preferably supplied while the distillation aid is supplied.

All of the plurality of impurity conversion step sections may be unified into any of the 4 configurations described above or in a combination of these configurations. For example, in an aspect, at least one of the plurality of impurity conversion step sections may comprise, between the vaporizer 30 and the transmission section, a distiller 40 that separates the distillation aid and high boiling point compounds.

The transmission of the trichlorosilane from which high boiling point compounds are separated to the subsequent stage section may be conducted in a vaporized state or in a state of a condensate, but the trichlorosilane is preferably transmitted in a state of a condensate when the distillation aid used is liquid.

Furthermore, when a distillation aid is introduced, it may be supplied either into the liquid or onto the surface of the liquid, but when a distillation aid used is gas and supplied to liquid trichlorosilane, the distillation aid is preferably supplied into the liquid. When one of trichlorosilane and the distillation aid is gas and the other is liquid, the distillation aid may be introduced in a state where minute air bubbles are produced in the liquid in order to increase the gas/liquid contact efficiency.

The distillation aid preferably comprises at least one compound selected from aromatic aldehyde, oxygen, and ozone. When the distillation aid is a combination of aromatic aldehyde and oxygen or ozone, it is preferable to mix the aromatic aldehyde first and oxygen or ozone subsequently, but, without being limited thereto, another way of mixing may be adopted.

The amount of the dopant impurity is measured beforehand by sampling the trichlorosilane comprising the impurities before treatment and performing photoluminescence (PL) analysis of crystals precipitated in a small reactor. With an actual reactor, the impurities can be converted into high boiling point compounds by supplying trichlorosilane comprising the amount of substance of the impurities made known by the measurement described above and the amount of substance of the distillation aid sufficient for reacting with the impurities to each of the impurity conversion step sections. The amount of substance of the distillation aid supplied to each of the plurality of impurity conversion step sections is preferably 1 to $10^9$ times, more preferably $10^2$ to $10^9$ times, and further preferably $10^4$ to $10^9$ times the amount that allows the distillation aid to react with the total amount of the impurities contained in the chlorosilane to thereby convert all thereof into the high boiling point compounds. The upper limit of these numerical ranges is set at $10^9$ times because if this numerical value exceeds $10^9$ times, then the amount of the distillation aid added is in the % order, resulting in oversupply.

The reaction temperature in a state where the distillation aid is introduced into an impurity conversion step section is 0° C. or more, preferably 10° C. or more, or further preferably 20° C. or more because the conversion reaction is unlikely to proceed at too low temperature and 150° C. or less, preferably 100° C. or less, or further preferably 50° C. or less because a side reaction of the distillation aid may proceed at too high temperature.

By using trichlorosilane produced by such a system as a raw material, polycrystalline silicon comprising donor impurities at a concentration of 2 ppta or less and acceptor impurities at a concentration of 20 ppta or less is obtained.

As seen above, in the system according to the present invention, in purifying trichlorosilane comprising an impurity serving as a donor or an acceptor in a silicon crystal, an impurity conversion section that converts an impurity comprised in trichlorosilane into a high boiling point compound in the presence of a distillation aid is composed of a plurality of impurity conversion step sections. Therefore, re-contamination by the dissociation of the adducts and/or the remaining of the impurities due to the equilibrium constraint can be prevented.

As a result, mixing of donor and acceptor impurities into polycrystalline silicon is suppressed in the production of polycrystalline silicon using trichlorosilane purified by the aforementioned system.

Moreover, in one aspect of the system according to the present invention, the discharge of the distillation aid and trichlorosilane out of the system can be minimized because the remainder of trichlorosilane containing the distillation aid is re-supplied from the subsequent stage section to the preceding stage section.

Moreover, a system of an aspect in which trichlorosilane is supplied from the preceding stage section to the subsequent stage section in a gas state requires no special facilities or electricity for liquefaction.

EXAMPLES

In the following Examples and Comparative Examples, specific examples in which trichlorosilane comprising 139 ppta phosphorus as a donor impurity and 387 ppta boron as an acceptor impurity is treated with a system according to the present invention will be described.

Example 1

In a system according to the aspect illustrated in the block diagram of FIG. 2, impurity conversion step sections were configured as in FIG. 5(A) and these 2 impurity conversion step sections (the number of treatment stages=2) were connected in series to form an impurity conversion section.

Trichlorosilane containing the aforementioned impurities was supplied to the multistage impurity conversion section. Benzaldehyde in an amount of 24 million times and oxygen (1.6% by volume, nitrogen base) in an amount of 7.35 million times the total amount of substance of phosphorus and boron were supplied in each stage and the trichlorosilane was treated to obtain 2.5 kg of trichlorosilane after the 2-stage treatment as a sample. The obtained sample was subjected to silicon crystallization using a small reactor for polycrystalline silicon precipitation, and the phosphorus concentration and the boron concentration were measured by photoluminescence (PL) analysis. The total amount of benzaldehyde and oxygen supplied was approximately $3.1 \times 10^7$ times the total amount of substance of phosphorus and boron. This numerical value is within the "1 to $10^9$ times," which is stated above as a preferred range of the amount of substance of the distillation aid supplied to each of the plurality of impurity conversion step sections, the amount that allows the distillation aid to react with the total amount of the impurities contained in chlorosilane to thereby convert all thereof into the high boiling point compounds.

Example 2

The same treatment as in Example 1 except that 3 impurity conversion step sections (the number of treatment stages=3) were connected in series to form an impurity conversion section was conducted to obtain 2.5 kg of trichlorosilane as a sample.

Comparative Example 1

The same treatment as in Example 1 except that only one impurity conversion step section (the number of treatment stages=1) was used as an impurity conversion section was conducted to obtain 2.5 kg of trichlorosilane as a sample.

Results of Example 1, Example 2, and Comparative Example 1 were summarized in Table 1.

TABLE 1

| | Number of treatment stages | Phosphorus concentration | Boron concentration | Resistivity |
|---|---|---|---|---|
| Example 1 | 2 | 33 ppta | 3.5 ppta | 2888 Ω · cm |
| Example 2 | 3 | 17 ppta | <2 ppta | 5018 Ω · cm |
| Comparative Example 1 | 1 | 46 ppta | 6.5 ppta | 2156 Ω · cm |

From the result illustrated in Table 1, it can be found that increase in the number of treatment stages lowers the phosphorus and boron concentrations of the polycrystalline silicon samples and raises the resistivity. In particular, in Example 2 with a number of treatment stages of 3, a high resistivity value exceeding 5000 Ω·cm was obtained for the silicon crystals, indicating that crystals having an extremely low impurity concentration were obtained. Therefore, it is indicated that the purity of trichlorosilane can be increased by increasing the number of treatment stages.

Example 3

Figure 7:
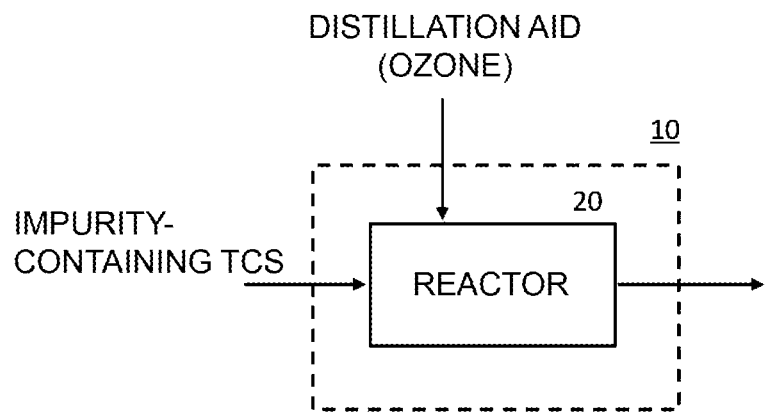
FIG. 7 is a block diagram illustrating other configuration examples of the impurity conversion step section.
Figure 7:
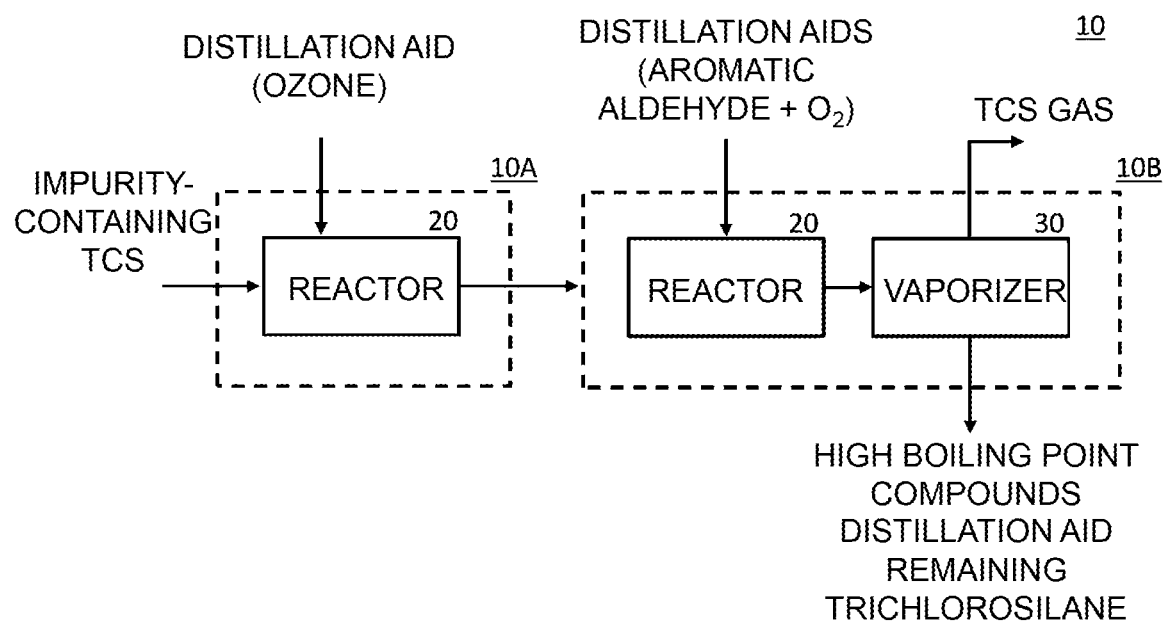

FIG. 7(A) and FIG. 7(B) are block diagrams illustrating other configuration examples of the impurity conversion step section 10. In the example illustrated in FIG. 7(A), ozone is supplied as a distillation aid to the reactor 20 composing the impurity conversion step section 10. Oxygen and an aromatic aldehyde-based agent are used in combination as distillation aids in the conventional art, whereas ozone can efficiently convert phosphorus impurities into high boiling point compounds and facilitates the removal of phosphorus impurities because ozone is more oxidative than oxygen. Moreover, the impurity conversion step section 10 in such a configuration is also effective for reducing only the phosphorus impurity concentration because no aromatic aldehyde-based agent is supplied as a distillation aid. The concentration of ozone supplied is preferably in the range of approximately 1 to $10^4$ ppmv. An ozone concentration higher than $10^4$ ppmv increases the risk of explosion and an ozone concentration lower than 1 ppmv makes the concentration control difficult.

In FIG. 7(B), an impurity conversion step section 10A with the configuration illustrated in FIG. 7(A) is provided before an impurity conversion step section, and an impurity conversion step section 10B with a reactor 20 and a vaporizer 30 is placed after the impurity conversion step section 10A. The configuration itself of the subsequent impurity conversion step section 10B is the same as illustrated in FIG. 5(A), but oxygen and the aromatic aldehyde-based agent as distillation aids are simultaneously supplied to the reactor 20 when impurity-containing TCS supplied from the preceding impurity conversion step section 10A is added.

In impurity conversion step sections with the configuration illustrated in FIG. 7(B), the impurity conversion treatment is divided into 2 stages: the earlier and later stages wherein the ozone treatment is conducted in the earlier stage and then usual chemical treatment is conducted in the later stage, because it is considered that there is a possibility of producing byproducts when ozone and benzaldehyde coexist. As described above, such a configuration can efficiently convert phosphorus impurities into high boiling point compounds and facilitates the removal of phosphorus impurities at the treatment in the earlier stage.

Also in the configuration example illustrated in FIG. 7(B) described above, a distiller 40 for further separation of the distillation aid and high boiling point compounds of impurities may be provided after the vaporizer 30, as illustrated in FIG. 6(A) and FIG. 6(B).

A multistage impurity conversion step section 10 with a configuration illustrated in FIG. 7(B) was used as an impurity conversion step section, and distillation was performed by supplying trichlorosilane (3 kg) containing 139 ppta phosphorus as a donor impurity and 387 ppta boron as an acceptor impurity to this impurity conversion step section 10.

A He mixed gas having an ozone concentration of 500 ppmv was passed through the impurity conversion step section 10A as the earlier stage at 100 cc/min for 120 minutes. On the other hand, $O_2$ (1.6 vol %)/He mixed gas was passed through the impurity conversion step section 10B as the later stage at 100 cc/min for 120 minutes after 1 wt % of benzaldehyde was added thereto. The TCS after distillation obtained from the impurity conversion step section 10B was heated to be singly vaporized, and the condensate was sampled. The TCS obtained by this sampling was used as a raw material and subjected to silicon crystallization using a small reactor for polycrystalline silicon precipitation, and the phosphorus concentration was measured by photoluminescence (PL) analysis.

Comparative Example 2

The same treatment as in Example 3 except that a single stage of the impurity conversion step section 10B, but not the impurity conversion step section 10A, was used for the impurity conversion step section was conducted to obtain TCS after distillation as a sample. The TCS obtained by this sampling was used as a raw material and subjected to silicon crystallization using a small reactor for polycrystalline silicon precipitation and the phosphorus concentration was measured by the photoluminescence (PL) analysis.

Results of the measurement of the phosphorus concentrations in Example 3 and Comparative Example 2 were summarized in Table 2.

TABLE 2

| | Number of treatment stages | Phosphorus concentration |
|---|---|---|
| Example 3 | 2 | 21 ppta |
| Comparative Example 2 | 1 | 38 ppta |

The present invention provides a system for purifying trichlorosilane that can efficiently remove donor and acceptor impurities from trichlorosilane by making full use of the effect of a distillation aid and prevent re-contamination by the dissociation of an adduct occurring in association with the conversion of a high boiling point compound or the remaining of impurities due to an equilibrium constraint.

What is claimed is:

1. A system for purifying trichlorosilane comprising an impurity serving as a donor or an acceptor in a silicon crystal, the system comprising:
   an impurity conversion section that converts the impurity in the trichlorosilane into a high boiling point compound in the presence of a distillation aid, and
   a purification section that distils and purifies the trichlorosilane supplied from the impurity conversion section,
   the impurity conversion section being composed of at least three impurity conversion step sections, wherein
   the impurity conversion step sections are connected in series, and
   any of the impurity conversion step sections comprises:
   a reception section for the trichlorosilane from the preceding stage section,
   an introduction section for the distillation aid, and
   a transmission section for the trichlorosilane to the subsequent stage section, and
   any of the impurity conversion step sections other than a first impurity conversion step section comprises a drain section that discharges a remainder from the impurity conversion step section, and wherein
   any of the impurity conversion step sections comprises a vaporizer, and the trichlorosilane from which the high boiling point compound is separated by vaporizing, with the vaporizer, the trichlorosilane treated in the impurity conversion step section is transmitted to the subsequent stage section.

2. The system for purifying trichlorosilane according to claim 1, wherein
   any of the drain sections discharges a remainder to a preceding impurity conversion step section.

3. The system for purifying trichlorosilane according to claim 1, wherein in at least one of the impurity conversion step sections, the reception section for the trichlorosilane from the preceding stage section and the introduction section for the distillation aid are integrated.

4. The system for purifying trichlorosilane according to claim 1, wherein at least one of the impurity conversion step sections comprises a distiller that separates the distillation aid and the high boiling point compound between the vaporizer and the transmission section.

5. The system for purifying trichlorosilane according to claim 1, wherein the transmission of the trichlorosilane from which the high boiling point compound is separated to the subsequent stage section is performed in a state of a liquid.

6. The system for purifying trichlorosilane according to claim 1, wherein the distillation aid comprises at least one compound selected from aromatic aldehyde, oxygen, and ozone.

7. The system for purifying trichlorosilane according to claim 6, wherein
   the distillation aid used in the first impurity conversion step section is ozone, and
   the distillation aid used in the second impurity conversion step section comprises at least one compound selected from aromatic aldehyde, oxygen, and ozone.

8. The system for purifying trichlorosilane according to claim 1, wherein the amount of substance of the distillation aid supplied to each of the impurity conversion step sections is 1 to $10^9$ times the amount that allows the distillation aid to react with the total amount of the impurities comprised in the chlorosilane to thereby convert all thereof into the high boiling point compound.

9. The system for purifying trichlorosilane according to claim 1, wherein a reaction temperature in a state where the distillation aid is introduced in the impurity conversion step sections is set at 0° C. or more and 150° C. or less.

* * * * *